United States Patent
Oki et al.

(10) Patent No.: US 9,437,719 B2
(45) Date of Patent: Sep. 6, 2016

(54) METHOD FOR MANUFACTURING SEMICONDUCTOR DEVICE HAVING GROOVED SURFACE

(71) Applicant: Toyota Jidosha Kabushiki Kaisha, Toyota-shi, Aichi-ken (JP)

(72) Inventors: Shuhei Oki, Nagakute (JP); Masaru Senoo, Okazaki (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/620,768

(22) Filed: Feb. 12, 2015

(65) Prior Publication Data

US 2015/0249084 A1 Sep. 3, 2015

(30) Foreign Application Priority Data

Mar. 3, 2014 (JP) .................. 2014-040414

(51) Int. Cl.
*H01L 29/66* (2006.01)
*H01L 29/739* (2006.01)
*H01L 27/07* (2006.01)

(52) U.S. Cl.
CPC ....... *H01L 29/7393* (2013.01); *H01L 27/0727* (2013.01); *H01L 29/66325* (2013.01)

(58) Field of Classification Search
CPC .................... H01L 27/0635; H01L 29/66325; H01L 29/7393
USPC .......................................................... 257/140
See application file for complete search history.

(56) References Cited

U.S. PATENT DOCUMENTS

| 5,258,077 A * | 11/1993 | Shahryar | H01L 31/068 136/256 |
| 2002/0153586 A1 | 10/2002 | Majumdar et al. | |
| 2007/0158680 A1 | 7/2007 | Ozeki et al. | |
| 2010/0323531 A1* | 12/2010 | Honda | H01L 21/28202 438/786 |

FOREIGN PATENT DOCUMENTS

| JP | 2002-314082 A | 10/2002 |
| JP | 2007-184486 A | 7/2007 |
| JP | 2011-134951 A | 7/2011 |
| JP | 4729953 B2 | 7/2011 |
| JP | 4907401 B2 | 3/2012 |

* cited by examiner

*Primary Examiner* — Matthew Gordon
(74) *Attorney, Agent, or Firm* — Dinsmore & Shohl LLP

(57) ABSTRACT

A technology for reducing contact resistance between a semiconductor substrate and an electrode is provided. A provided method for manufacturing a semiconductor device includes: forming an oxide film 62 on a surface 12b of a semiconductor substrate 12 by bringing the surface 12b into contact with ammonia-hydrogen peroxide water mixture; forming a groove 60 on the surface 12b by irradiating light to heat the surface 12b covered with the oxide film 62; removing the oxide film 62 to expose the surface 12b; and forming an electrode 16 on the exposed surface 12b.

14 Claims, 15 Drawing Sheets

METHOD FOR MANUFACTURING SEMICONDUCTOR DEVICE HAVING GROOVED SURFACE

CROSS-REFERENCE TO A RELATED APPLICATION

This application claims priority to Japanese Patent Application No. 2014-040414 filed on Mar. 3, 2014, the contents of which are hereby incorporated by reference into the present application.

TECHNICAL FIELD

A technology disclosed herein relates to a semiconductor device.

DESCRIPTION OF RELATED ART

Japanese Patent Application Publication, No. 2002-314082 A discloses an RC-IGBT. The RC-IGBT has an IGBT and a diode connected antiparallel to the IGBT.

BRIEF SUMMARY OF INVENTION

In the field of semiconductor devices, there has been a demand for a further reduction in contact resistance between a semiconductor substrate and an electrode.

This description discloses a method for manufacturing a semiconductor device. The method comprises: forming an oxide film on a surface of a semiconductor substrate by bringing the surface into contact with ammonia-hydrogen peroxide water mixture; forming a groove in the surface by irradiating light to heat the surface covered with the oxide film; removing the oxide film to expose the surface; and forming an electrode on the exposed surface.

This method irradiates with light the surface of the semiconductor substrate that is covered with the oxide film, and thereby heats the surface. In this step, the oxide film is not very much heated, as the oxide film has a high light transmittivity, and the surface of the semiconductor substrate is locally heated. Therefore, this method makes it possible to locally melt the surface of the semiconductor substrate without melting the oxide film. By thus melting the surface of the semiconductor substrate that is in contact with the oxide film, a groove is formed in the surface of the semiconductor substrate when the semiconductor substrate resolidifies. After that, the oxide film is removed and an electrode is formed on the surface thus exposed. The formation of the electrode on the surface in which the groove has been formed makes it possible to increase an area of contact between the electrode and the semiconductor substrate. Therefore, this method makes it possible to reduce contact resistance between the electrode and the semiconductor substrate.

Furthermore, this description discloses a semiconductor device comprising a semiconductor substrate in which an IGBT and a diode are formed. The semiconductor substrate comprises: an n-type cathode region of the diode, the cathode region being exposed at a surface of the semiconductor substrate; a p-type collector region of the IGBT, the collector region being exposed at the surface, being adjacent to the cathode region and arranged so as to surround the cathode region; an n-type buffer region, the buffer region being adjacent to the collector region and the cathode region from a deeper side, wherein an n-type impurity concentration in the buffer region is lower than that in the cathode region; and an n-type drift region, the drift region being adjacent to the buffer region from the deeper side, wherein an n-type impurity concentration in the drift region is lower than that in the buffer region. A groove surrounding the cathode region is formed in the surface in the collector region. An electrode is formed on the surface in the collector region and the cathode region.

This configuration makes it possible to reduce contact resistance between the electrode and the collector region, as the groove increases an area of contact between the electrode and the collector region. Further, this configuration makes it possible to reduce an on-voltage of the IGBT, as the groove inhibits an electrical current from flowing from the IGBT to the diode.

DETAILED DESCRIPTION OF INVENTION

Figure 1:
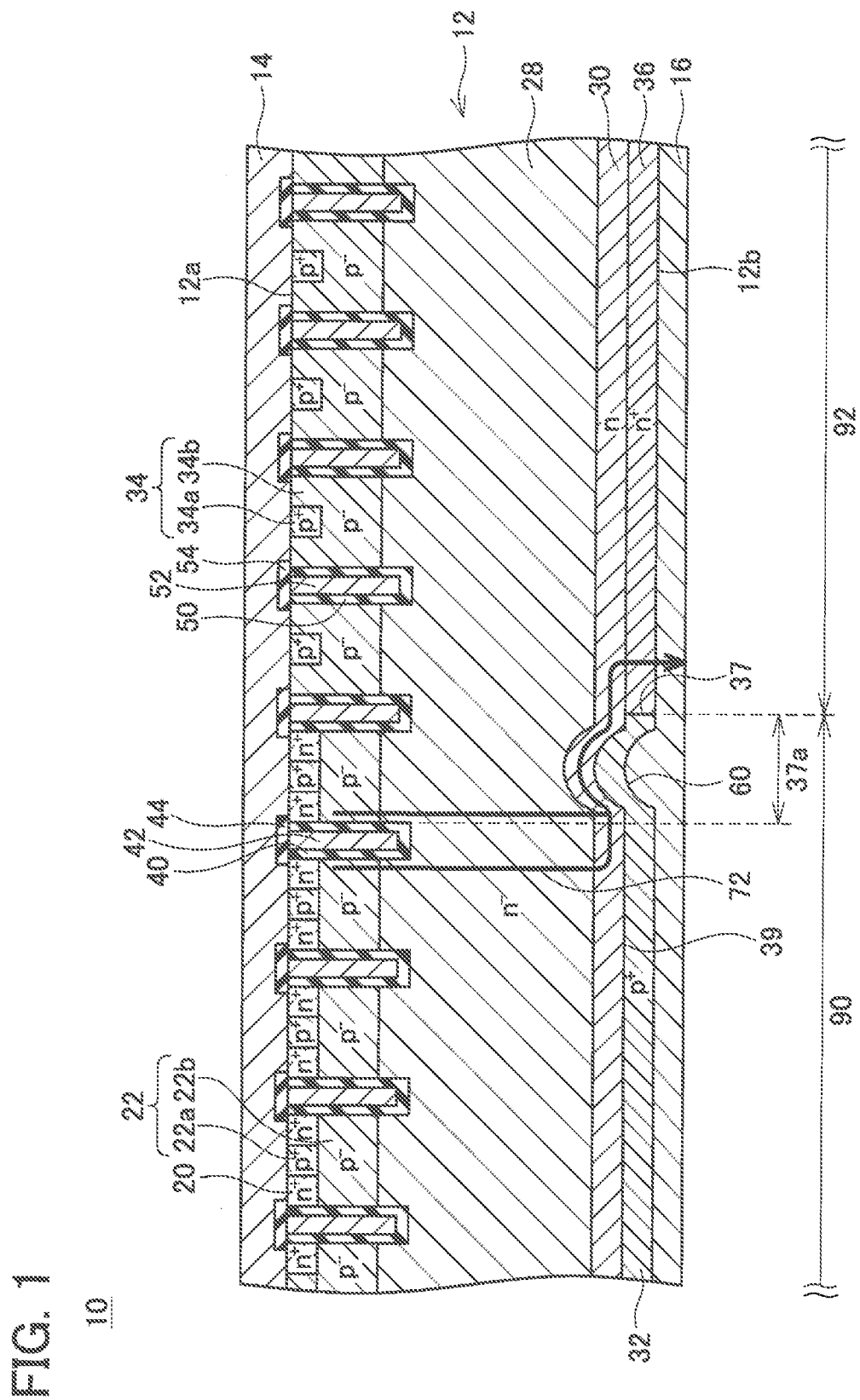
FIG. 1 is a longitudinal sectional view of a semiconductor device 10 of Embodiment 1.

First, the features of the embodiments to be described are listed below. It should be noted that each of the features listed below is independently useful.

(Feature 1) The semiconductor device may comprise: a p-type collector region of an IGBT, the collector region being exposed at the surface; an n-type cathode region of a diode, the cathode region being exposed at the surface and adjacent to the collector region; an n-type buffer region, the buffer region being adjacent to the collector region and the cathode region from a deeper side, wherein an n-type impurity concentration in the buffer region is lower than that in the cathode region; and an n-type drift region, the drift region being adjacent to the buffer region from the deeper side, wherein an n-type impurity concentration in the drift region is lower than that in the buffer region. It should be noted that the term "deeper side" means a side that is distant from the surface (i.e. the surface at which the collector region and the cathode region are exposed).

(Feature 2) A range to which the forming of the oxide film and the heating of the surface are performed may include the surface in the collector region located near a boundary between the cathode region and the collector region. It should be noted that Feature 2 is not intended to specify that the cathode region and the collector region are formed during the execution of the aforementioned two steps (i.e., the forming of the oxide film and the heating of the surface), and the range within which the aforementioned two steps are executed needs only satisfy the aforementioned relationship with respect to the cathode region and the collector region of the semiconductor device that is to be finally manufactured. Therefore, the cathode region and the collector region do not need to be formed during the execution of the aforementioned two steps.

(Feature 3) The collector region may be located so as to surround the cathode region. A range to which the forming of the oxide film and the heating of the surface are performed may be arranged on the surface in the collector region so as to surround the cathode region. It should be noted that Feature 3 is not intended to specify that the cathode region and the collector region are formed during the execution of the aforementioned two steps, and the range within which the aforementioned two steps are executed needs only satisfy the aforementioned relationship with respect to the cathode region and the collector region of the semiconductor device that is to be finally manufactured. Therefore, the cathode region and the collector region do not need to be formed during the execution of the aforementioned two steps.

(Feature 4) A range to which the forming of the oxide film and the heating of the surface are performed may not include at least a part of the surface in the cathode region. The method may further comprise: removing the oxide film on the part of the surface in the cathode region; and heating the part of the surface in the cathode region after the removal of the oxide film on the part of the surface in the cathode region. In the forming of the electrode, the electrode may be formed on the part of the surface in the heated cathode region after the heating of the part of the surface in the cathode region. It should be noted that Feature 4 is not intended to specify that the cathode region is formed during the execution of the step of forming the oxide film and the step of heating the surface, and the range within which these two steps are executed needs only satisfy the aforementioned relationship with respect to the cathode region of the semiconductor device that is to be finally manufactured. Therefore, the cathode region does not need to be formed during the execution of the aforementioned two steps.

(Feature 5) The groove may be formed only near the cathode region.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiment 1

Figure 2:
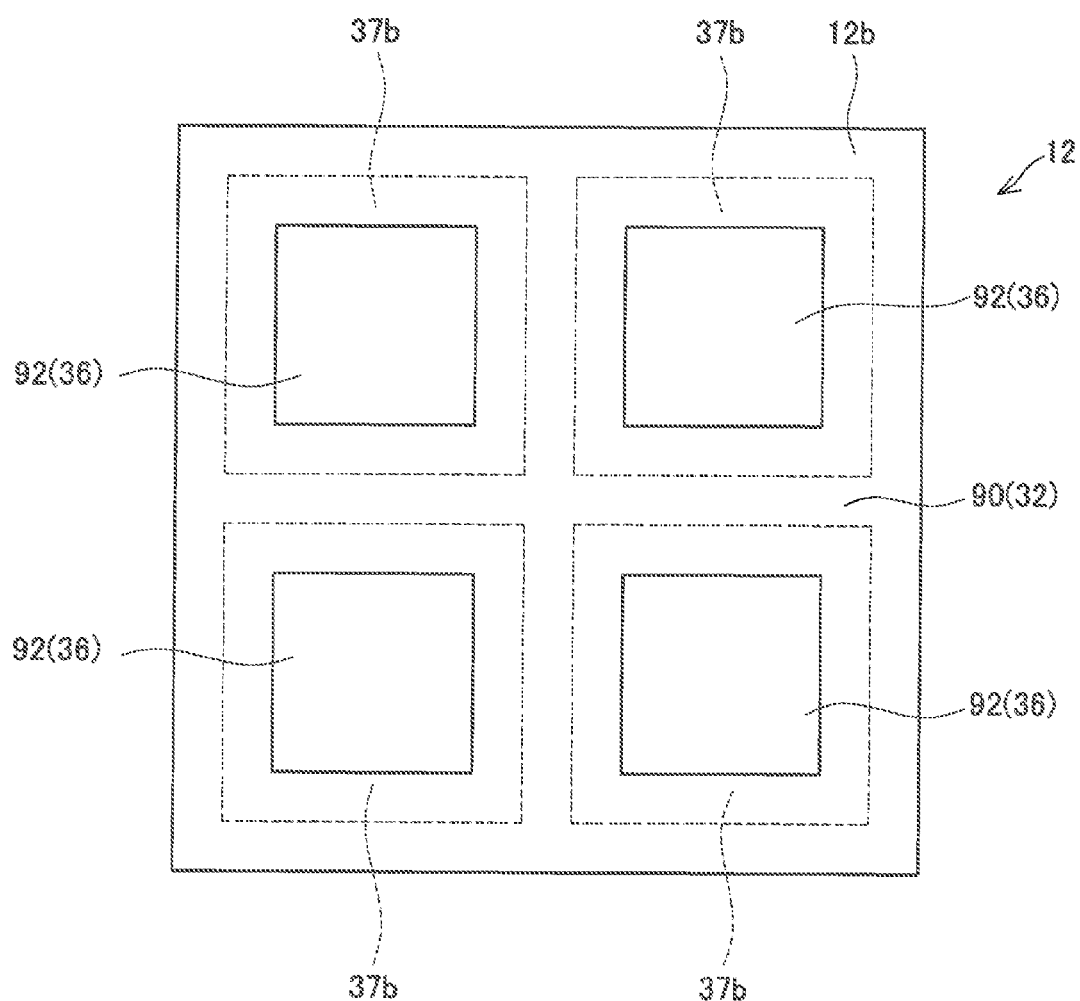
FIG. 2 is a plan view showing a lower surface 12b of the semiconductor device 10 of Embodiment 1.

A semiconductor device 10 of Embodiment 1 as shown in FIG. 1 includes a semiconductor substrate 12, an upper electrode 14, and a lower electrode 16. The semiconductor substrate 12 is a substrate made of silicon. The upper electrode 14 is formed on an upper surface 12a of the semiconductor substrate 12. The lower electrode 16 is formed on a lower surface 12b of the semiconductor substrate 12. The semiconductor substrate 12 has an IGBT region 90 in which an IGBT is formed and a diode region 92 in which a diode is formed. That is, the semiconductor device 10 is a so-called RC-IGBT. As shown in FIG. 2, each of the diode regions 92 is surrounded by the IGBT region 90.

As shown in FIG. 1, in the semiconductor substrate 12 within each diode region 92, an anode region 34, a drift region 28, a buffer region 30, and a cathode region 36 are formed.

The anode region 34 is of a p type, and is formed in a range exposed at the upper surface 12a of the semiconductor substrate 12. The anode region 34 has anode contact regions 34a and a low-concentration anode region 34b. The anode contact regions 34a are formed in a range exposed at the upper surface 12a of the semiconductor substrate 12. The anode contact regions 34a have a high p-type impurity concentration, and are connected to the upper electrode 14 by an Ohmic contact. The low-concentration anode region 34b is formed on a lower side of and lateral to the anode contact regions 34a. A p-type impurity concentration in the low-concentration anode region 34b is lower than that in the anode contact region 34a.

The drift region 28 is of an n type, and is formed on a lower side of the anode region 34. There is a substantially homogeneous distribution of n-type impurity concentrations within the drift region 28. In the present embodiment, the drift region 28 has an n-type impurity concentration of lower than $7.2 \times 10^{13}$ atoms/cm$^3$.

The buffer region 30 is of an n type, and is formed on a lower side of the drift region 28. An n-type impurity concentration in the buffer region 30 is higher than that in the drift region 28. In the present embodiment, the buffer region 30 has an n-type impurity concentration of $7.2 \times 10^{13}$ atoms/cm$^3$ or higher but lower than $1.0 \times 10^{17}$ atoms/cm$^3$.

The cathode region 36 is of an n type, and is formed on a lower side of the buffer region 30. An n-type impurity concentration in the cathode region 36 is higher than that in the buffer region 30. The cathode region 36 is formed in a range exposed at the lower surface 12b of the semiconductor substrate 12. In the present embodiment, the cathode region 36 has an n-type impurity concentration of $1.0 \times 10^{19}$ atoms/cm$^3$ or higher. The cathode region 36 is connected to the lower electrode 16 by an Ohmic contact.

In the upper surface 12a of the semiconductor substrate 12 within the diode region 92, a plurality of trenches is formed. Each of the trenches penetrates the anode region 34 and reaches the drift region 28. An inner surface of each of the trenches is covered with an insulating film 50. Inside each of the trenches, a control electrode 52 is formed. The control electrode 52 is insulated from the semiconductor substrate 12 by the insulating film 50. An upper surface 12a of the control electrode 52 is covered with an insulating film 54. The control electrode 52 is insulated from the upper electrode 14 by the insulating film 54.

In the semiconductor substrate 12 within the IGBT region 90, emitter regions 20, a body region 22, the drift region 28, the buffer region 30, and a collector region 32 are formed.

The emitter regions 20 are of an n type, and is formed in a range exposed at the upper surface 12a of the semiconductor substrate 12. The emitter regions 20 are connected to the upper electrode 14 by an Ohmic contact.

The body region 22 is of a p type, and is formed in a range exposed at the upper surface 12a of the semiconductor substrate 12. The body region 22 has body contact regions 22a and a low-concentration body region 22b. The body contact regions 22a are formed in a range exposed at the upper surface 12a of the semiconductor substrate 12. The body contact regions 22a have a high p-type impurity concentration, and are connected to the upper electrode 14 by an Ohmic contact. The low-concentration body region 22b is formed on a lower side of the emitter regions 20 and on a lower side of the body contact regions 22a. A p-type impurity concentration in the low-concentration body region 22b is lower than that in the body contact region 22a. The body region 22 is formed in substantially the same depth range as the anode region 34.

On a lower side of the body region 22, the aforementioned drift region 28 is formed. That is, the drift region 28 extends across the IGBT region 90 from the diode region 92. The drift region 28 is separated from the emitter regions 20 by the body region 22.

On the lower side of the drift region 28 within the IGBT region 90, the aforementioned buffer region 30 is formed. That is, the buffer region 30 extends across the IGBT region 90 from the diode region 92.

The collector region 32 is of a p type, and is formed on the lower side of the buffer region 30 within the IGBT region 90. The collector region 32 is formed in a range exposed at the lower surface 12b of the semiconductor substrate 12. The collector region 32 is connected to the lower electrode 16 by an Ohmic contact.

In the upper surface 12a of the semiconductor substrate 12 within the IGBT region 90, a plurality of trenches is formed. Each of the trenches penetrates the emitter region 20 and the low-concentration body region 22b and reaches the drift region 28. An inner surface of each of the trenches is covered with a gate insulating film 40. Inside each of the trenches, a gate electrode 42 is formed. The gate electrode 42 is insulated from the semiconductor substrate 12 by the gate insulating film 40. The gate electrode 42 faces the emitter region 20, the low-concentration body region 22b, and the drift region 28 with the gate insulating film 40 therebetween. An upper surface 12a of the gate electrode 42 is covered with an insulating film 44. The gate electrode 42 is insulated from the upper electrode 14 by the insulating film 44.

In the lower surface 12b of the semiconductor substrate 12, a groove 60 is formed. As illustrated, the groove 60 has a curved cross-sectional shape. The groove 60 is formed /in a lower surface in the collector region 32 located near a boundary 37 between the cathode region 36 and the collector region 32. More specifically, in the cross-section shown in FIG. 1, the groove 60 is formed in the lower surface 12b in a region 37a located between the boundary 37 and the gate electrode 42 that is closest to the boundary 37 (excluding the gate electrode 42 located directly above the boundary 37). Further, when the lower surface 12b is viewed in plan view, the groove 60 is formed within a region 37b (i.e. a region extending around the cathode region 36) shown in FIG. 2. The groove 60 extends in such a manner as to meander through the region 37b when the lower surface 12b of the semiconductor substrate 12 is viewed in plan view. The groove 60 extends around the cathode region 36. That is, the groove 60 surrounds the cathode region 36. As shown in FIG. 1, the collector region 32, the buffer region 30, and the drift region 28 are also formed above the groove 60. Portions of the collector region 32 and the buffer region 30 that are located above the groove 60 are curved along the shape of the groove 60. For this reason, the portion of the collector region 32 that is located above the groove 60 is shifted upward (toward the upper surface 12a) as compared with the other portions of the collector region 32. Further, the portion of the buffer region 30 that is located above the groove 60 is shifted upward as compared with the other portions of the buffer region 30.

When a voltage that causes the upper electrode 14 to be positive is applied between the upper electrode 14 and the lower electrode 16, the diode in the diode region 92 is turned on. That is, an electrical current flows from the anode region 34 toward the cathode region 36.

Further, when a voltage that causes the lower electrode 16 to be positive is applied between the upper electrode 14 and the lower electrode 16 and a high potential (gate-on potential) is applied to the gate electrode 42, the IGBT in the IGBT region 90 is turned on. That is, a channel is formed at a position in the body region 22 that faces the gate electrode 42 (i.e. at a position in the body region 22 that is in contact with the gate insulating film 40). This causes electrons to flow from the upper electrode 14 to the lower electrode 16 via the emitter regions 20, the channel in the body region 22, the drift region 28, the buffer region 30, and the collector region 32. Further, holes flow from the lower electrode 16 to the upper electrode 14 via the collector region 32, the buffer region 30, the drift region 28, and the body region 22. Switching the potential of the gate electrode 42 to a low potential causes the channel to disappear and the IGBT to be turned off accordingly.

Figure 3:
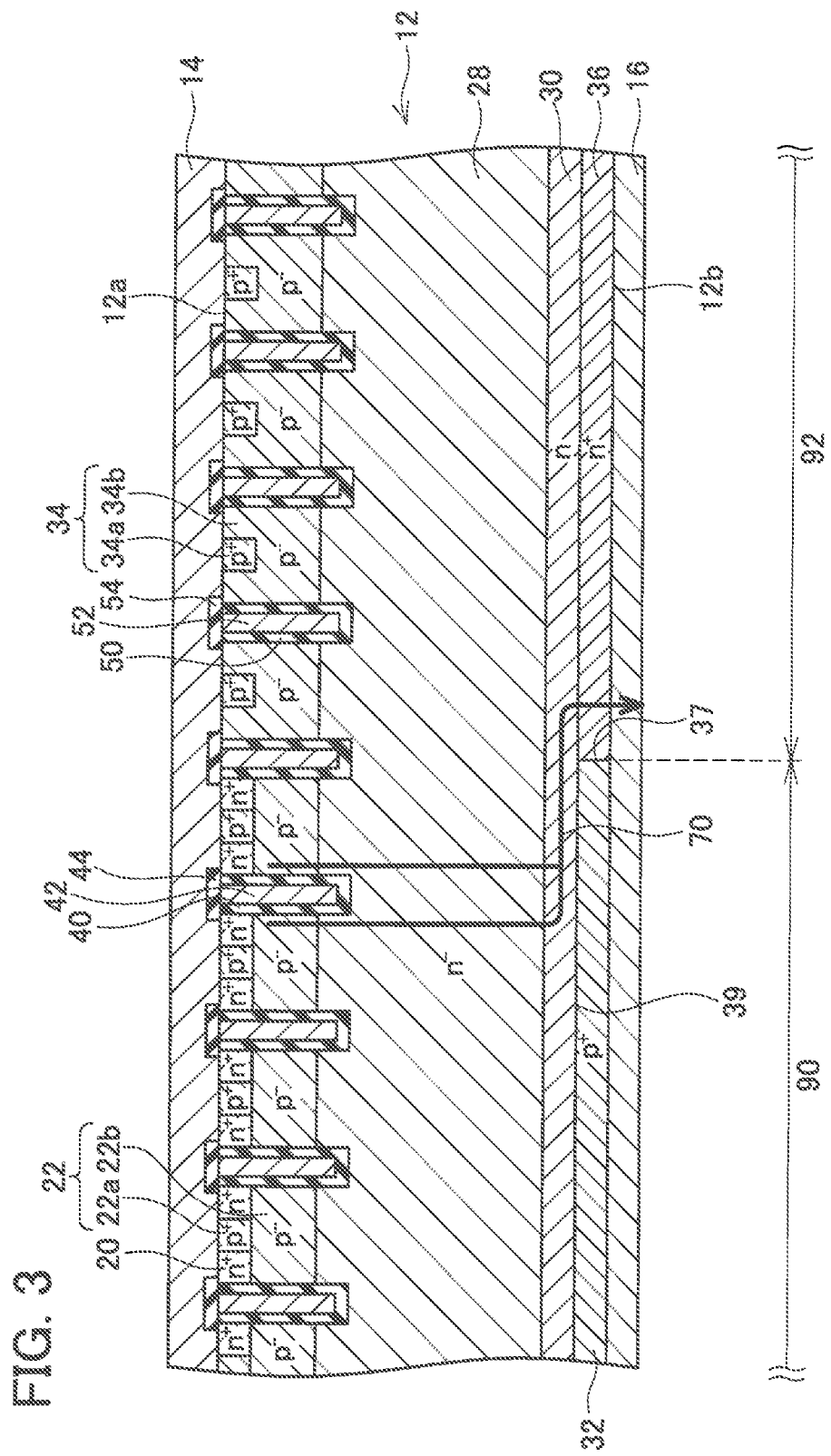
FIG. 3 is a longitudinal sectional view of a semiconductor device of a comparative example.
Figure 4:
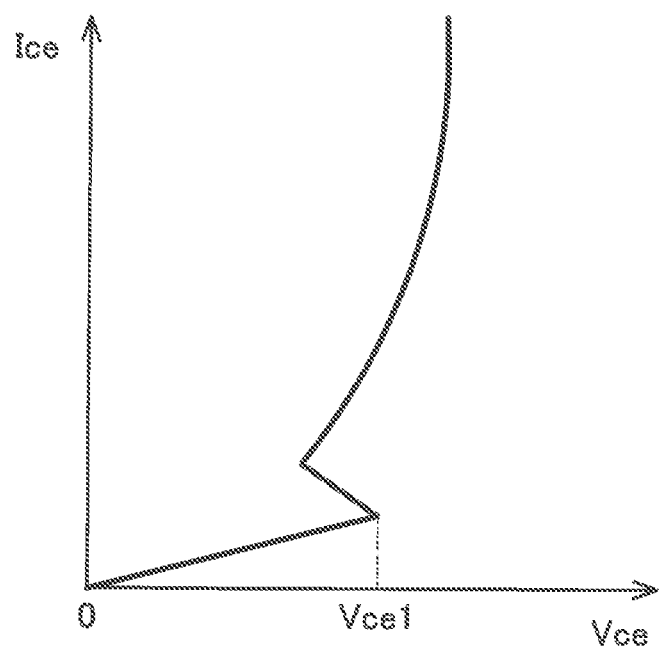
FIG. 4 is an explanatory diagram of a snapback operation.

Next, an operation in which the IGBT is turned on is described in more detail. First, the operation of a semiconductor device of a comparative example as shown in FIG. 3 is described. The semiconductor device of FIG. 3 has the same components as those of the semiconductor device 10 of Embodiment 1, except that it does not have a groove 60. Suppose a case where a potential Vce of the lower electrode 16 is gradually raised with a gate-on potential being applied. In this case, since, in a state where the potential Vce is low, there is no sufficient potential difference at a p-n junction 39 between the collector region 32 and the buffer region 30, the p-n junction 39 is not turned on. For this reason, as indicated by an arrow 70 in FIG. 3, electrons flow from the IGBT region 90 into the diode region 92 via the buffer region 30. The electrons having flowed into the diode region 92 flow toward the lower electrode 16 via the cathode region 36. Therefore, as shown in FIG. 4, even in the state where the potential Vce is low, an electrical current Ice flowing through the IGBT gradually rises as the potential Vce rises. At a point in time where the potential Vce has risen to a predetermined potential Vce1, the p-n junction 39 is turned on. Then, the potential Vce abruptly decreases. After that, raising the potential Vce causes the electrical current Ice to abruptly increase. Such an operation when the IGBT is turned on in which the potential Vce rises to Vce1 and, after that, the electrical current Ic rises after the Vce abruptly lowers, is called a snapback operation. The occurrence of a snapback operation makes it difficult to control the IGBT. Further, the flow of electrons as indicated by the arrow 70 in FIG. 3 makes it difficult for a voltage to be applied to the p-n junction 39, thus making it difficult for the p-n junction 39 to be turned on. That is, an on voltage of the IGBT becomes higher.

Next, an operation in which the IGBT is turned on in the semiconductor device 10 of Embodiment 1 is described. As shown in FIG. 1, the semiconductor device 10 of Embodiment 1 has the groove 60. The formation of the groove 60 causes the portion of the buffer region 30 that is located above the groove 60 to be shifted upward. For this reason, a current pathway passing through the buffer region 30 as indicated by an arrow 72 is longer than a current pathway indicated by an arrow 70 in FIG. 3. For this reason, the resistance of the current pathway indicated by the arrow 72 is higher than the resistance of the current pathway indicated by the arrow 70. Therefore, in the semiconductor device 10 of Embodiment 1, electrons are inhibited from flowing as indicated by the arrow 72. This makes it difficult for the snapback operation to occur in the semiconductor device 10 of Embodiment 1. Further, since the flow of electrons as indicated by the arrow 72 is inhibited, the p-n junction 39 is easily turned on in the semiconductor device 10 of Embodiment 1. That is, the semiconductor device 10 of Embodiment 1 has a low on-voltage. In particular, in the semiconductor device 10 of Embodiment 1, the groove 60 is formed in such a manner as to extend around the cathode region 36. Therefore, in all of the boundary part surrounding the cathode region 36, the flow of electrons from the IGBT region 90 into the cathode region 92 via the buffer region 30 is inhibited. For this reason, the semiconductor device 10 of Embodiment 1 is especially highly effective in inhibiting a snapback operation and in reducing the on-voltage.

Further, in the semiconductor device 10 of Embodiment 1, the formation of the groove 60 increases an area of contact between the collector region 32 and the lower electrode 16. This reduces contact resistance between the collector region 32 and the lower electrode 16. Since the lower electrode 16 needs to be connected to both the p-type collector region 32 and the n-type cathode region 36 by Ohmic contacts, there is a limitation on the range of materials from which to select a material of which the lower electrode 16 is made. For this reason, there is a limitation in reducing the contact resistance of the lower electrode 16 solely through selection of the material. The structure of the semiconductor device 10 of Embodiment 1 makes it possible to reduce the contact resistance of the lower electrode 16 regardless of the material of which the lower electrode 16 is made.

Further, in the semiconductor device 10 of Embodiment 1, the groove 60 brings about an anchor effect of making it difficult for the lower electrode 16 to come off from the lower surface 12b of the semiconductor substrate 12.

Figure 5:
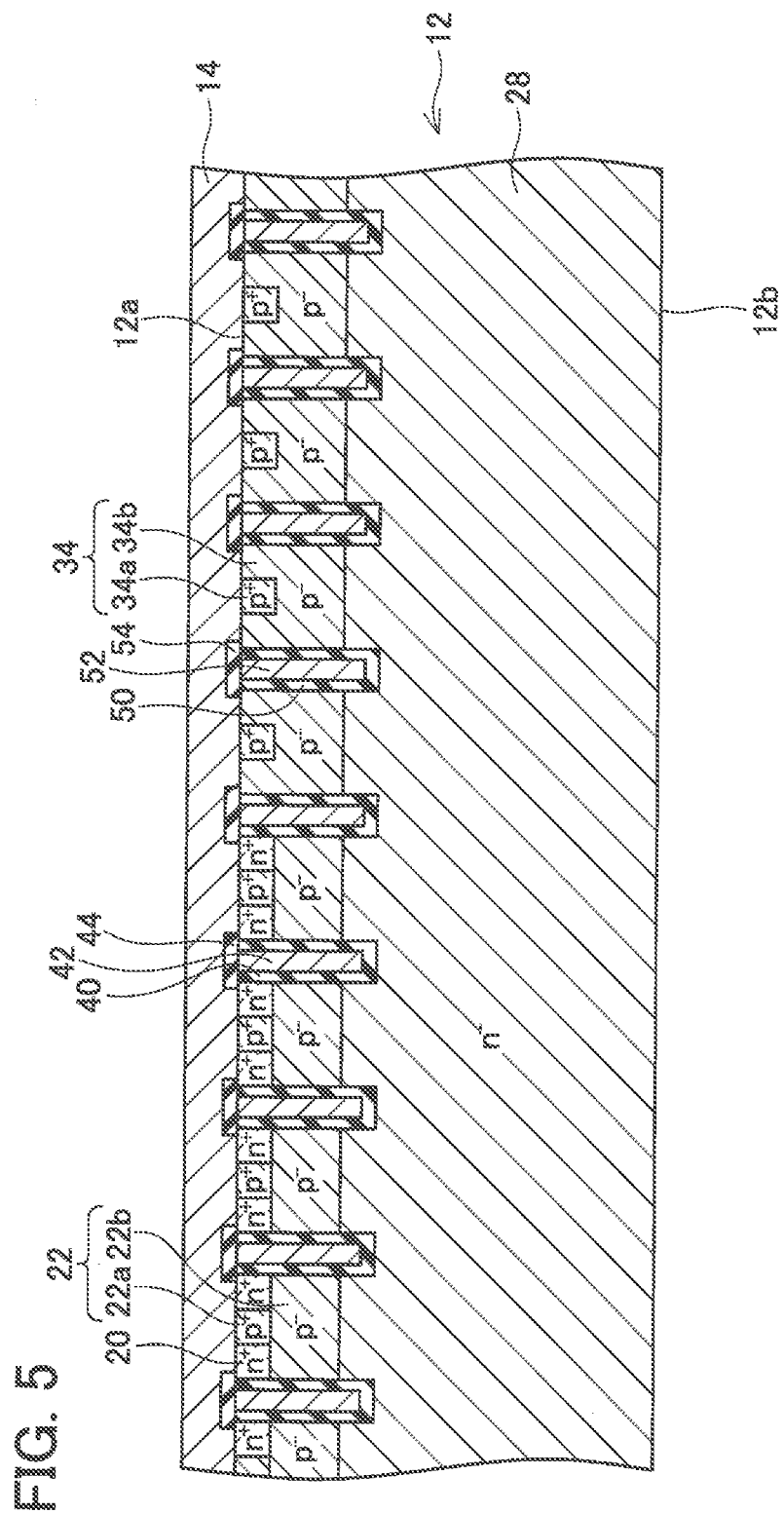
FIG. 5 is a diagram showing a process for manufacturing the semiconductor device 10 of Embodiment 1.

Next, a method for manufacturing the semiconductor device 10 of Embodiment 1 is described. First, the structures at the upper surface side of the semiconductor device 10 are formed. At this stage, the structures at the lower surface side of the semiconductor device 10 have not been formed, and the drift region 28 (i.e. a low-concentration n-type region) is exposed at the lower surface 12b. Next, the semiconductor substrate 12 is made thinner by polishing the lower surface 12b. Thus, a structure shown in FIG. 5 is obtained.

Figure 6:
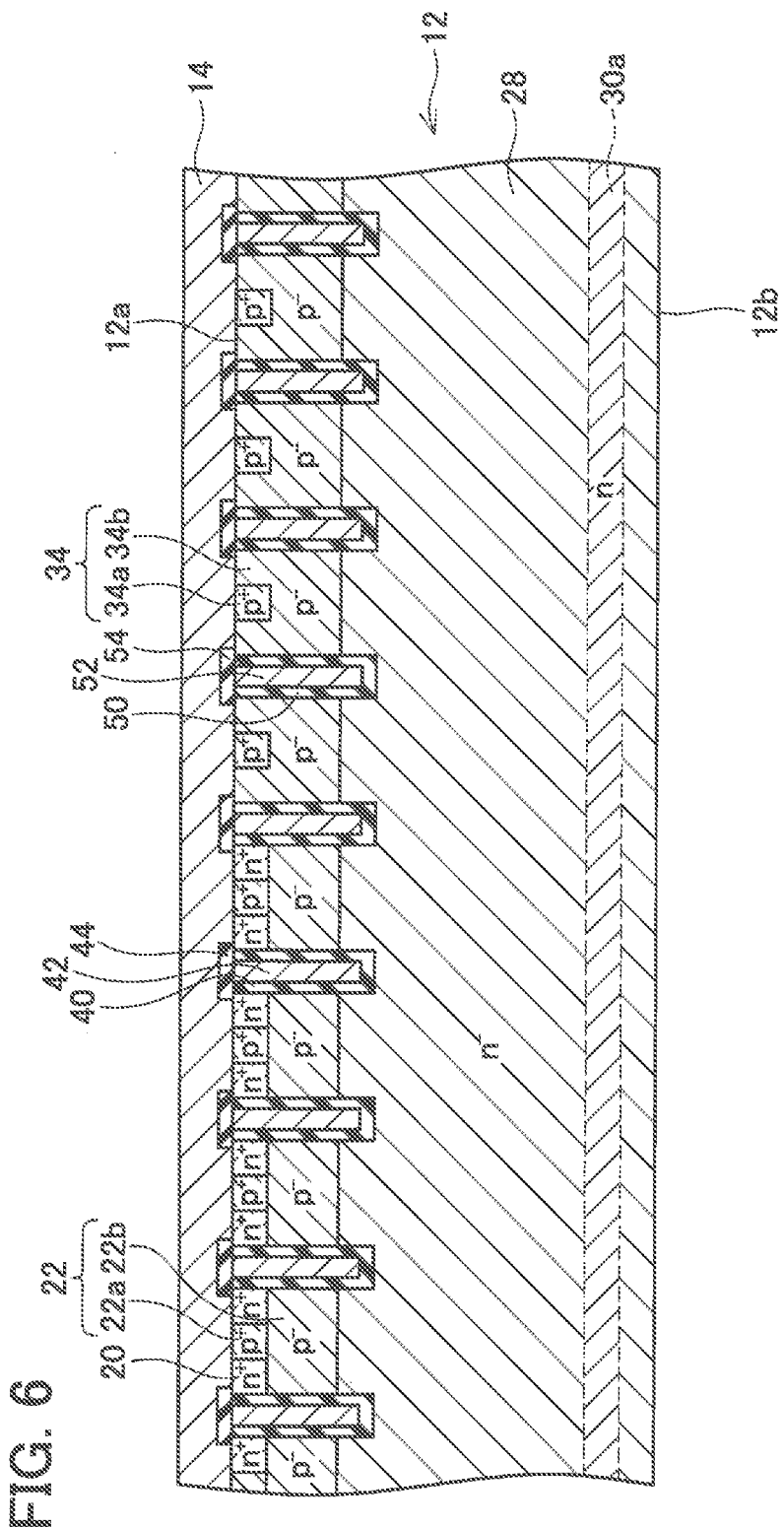
FIG. 6 is a diagram showing the process for manufacturing the semiconductor device 10 of Embodiment 1.

Next, n-type impurities are implanted into the entire area of the lower surface 12b of the semiconductor substrate 12 (buffer implanting step). In this step, implantation energy is adjusted so that the average stopping depth of the n-type impurities is equal to the depth of the buffer region 30. Thus, as shown in FIG. 6, a region 30a having a high n-type impurity concentration is formed.

Figure 7:
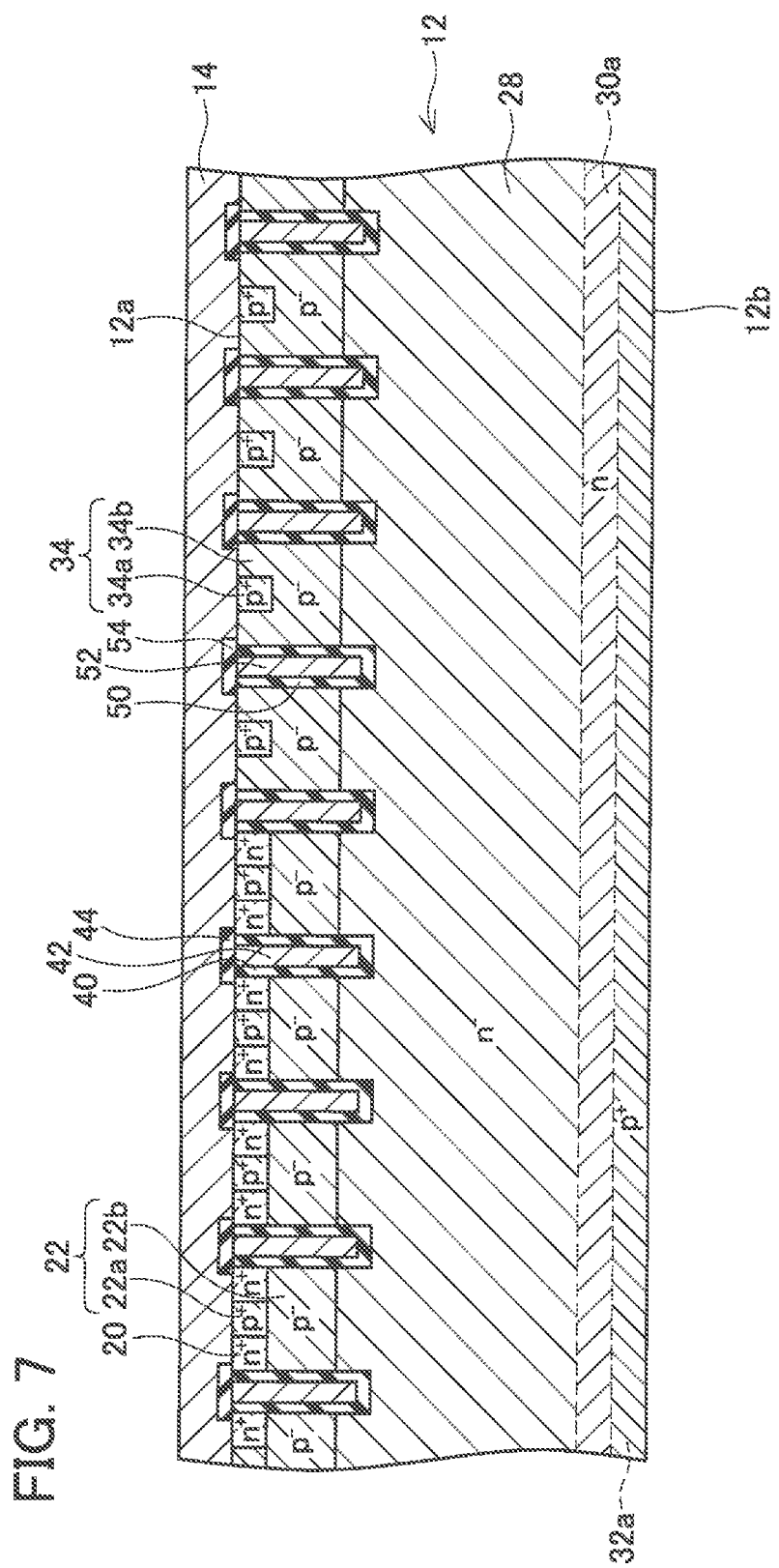
FIG. 7 is a diagram showing the process for manufacturing the semiconductor device 10 of Embodiment 1.

Next, p-type impurities are implanted into the entire area of the lower surface 12b of the semiconductor substrate 12 (collector implanting step). In this step, implantation energy is adjusted so that the average stopping depth of the p-type impurities is equal to the depth of the collector region 32. Thus, as shown in FIG. 7, a region 32a having a high p-type impurity concentration is formed in a range exposed at the lower surface 12b.

Figure 8:
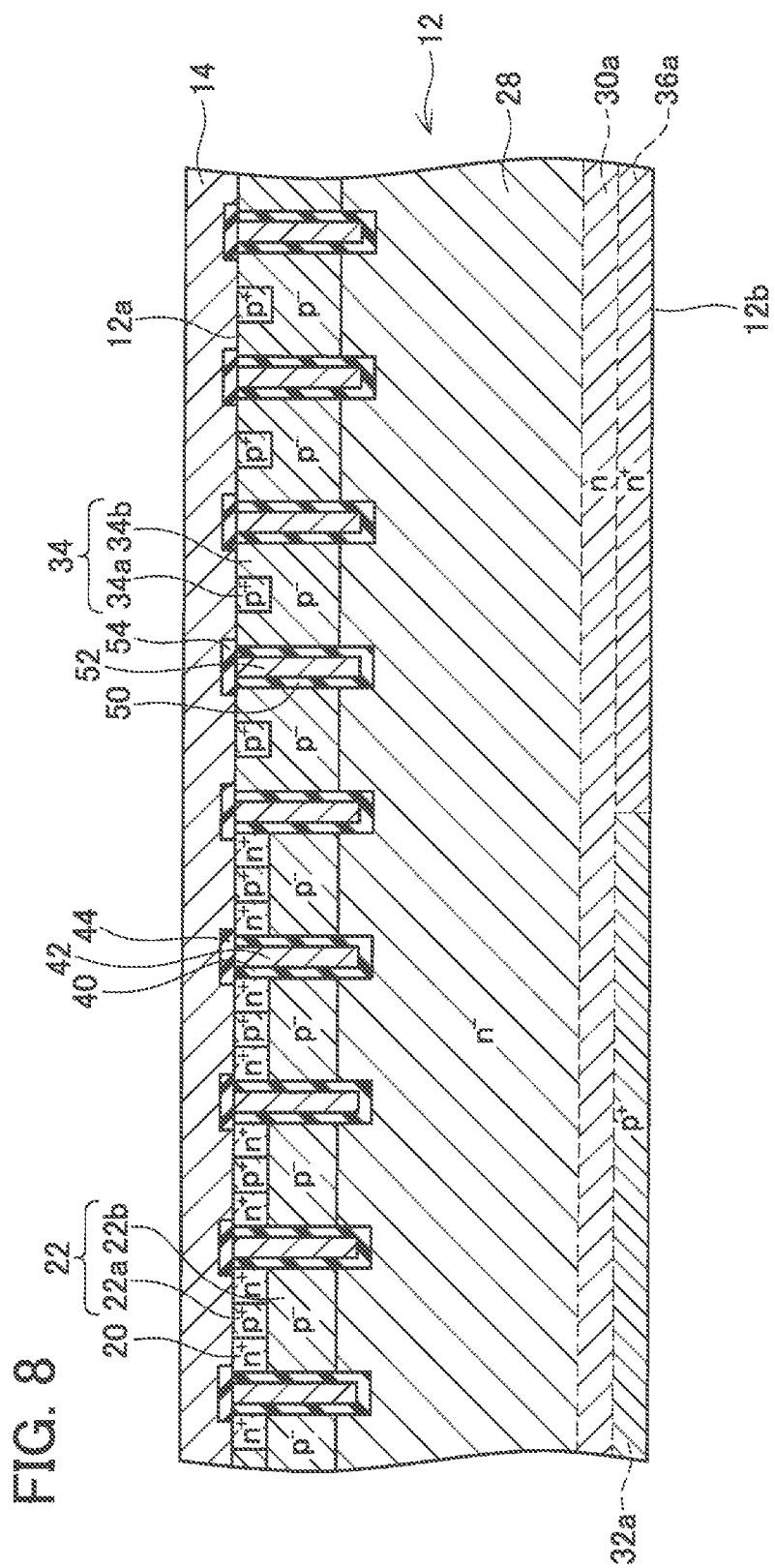
FIG. 8 is a diagram showing the process for manufacturing the semiconductor device 10 of Embodiment 1.

Next, n-type impurities are implanted into the lower surface 12b of the semiconductor substrate 12 with a mask on an area on the lower surface 12b of the semiconductor substrate 12 where the collector region 32 is to be formed. That is, the n-type impurities are implanted into an area where the cathode region 36 is to be formed (cathode implanting step). In this step, implantation energy is adjusted so that the average stopping depth of the n-type impurities is equal to the depth of the cathode region 36. Further, in this step, the n-type impurities are implanted so that a concentration of the n-type impurities is higher than that of the p-type impurities implanted in the collector implanting step. Further, in this step, the n-type impurities are implanted so that the concentration of the n-type impurities is higher than that of the n-type impurities implanted in the buffer implanting step. Thus, as shown in FIG. 8, a region 36a having a high n-type impurity concentration is formed in a range exposed at the lower surface 12b.

Figure 9:
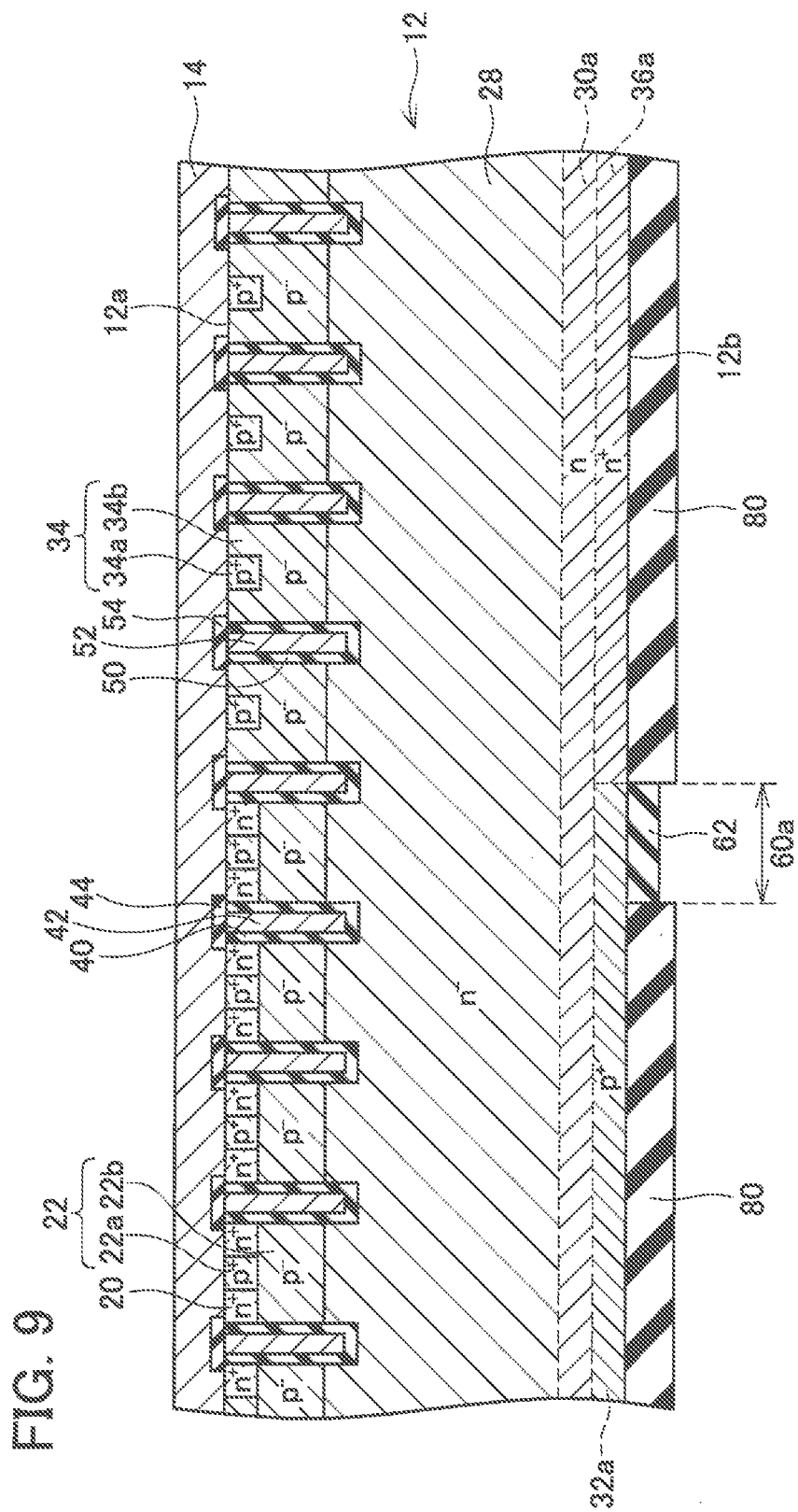
FIG. 9 is a diagram showing the process for manufacturing the semiconductor device 10 of Embodiment 1.

Next, as shown in FIG. 9, the outside of an area 60a on the lower surface 12b where the groove 60 is to be formed is covered with a mask 80. Next, the lower surface 12b is brought into contact with ammonia-hydrogen peroxide water mixture (i.e. APM: Ammonia Peroxide-water Mixture). The ammonia-hydrogen peroxide water mixture is a mixture of ammonia and hydrogen peroxide water. In this step, the ammonia-hydrogen peroxide water mixture may be applied onto the lower surface 12b by spin coating, or the semiconductor substrate 12 may be immersed in the ammonia-hydrogen peroxide water mixture. Thus, a portion of the lower surface 12b that is located within the area 60a is oxidized, whereby an oxide film ($SiO_2$ film) 62 is formed within the area 60a.

Figure 10:
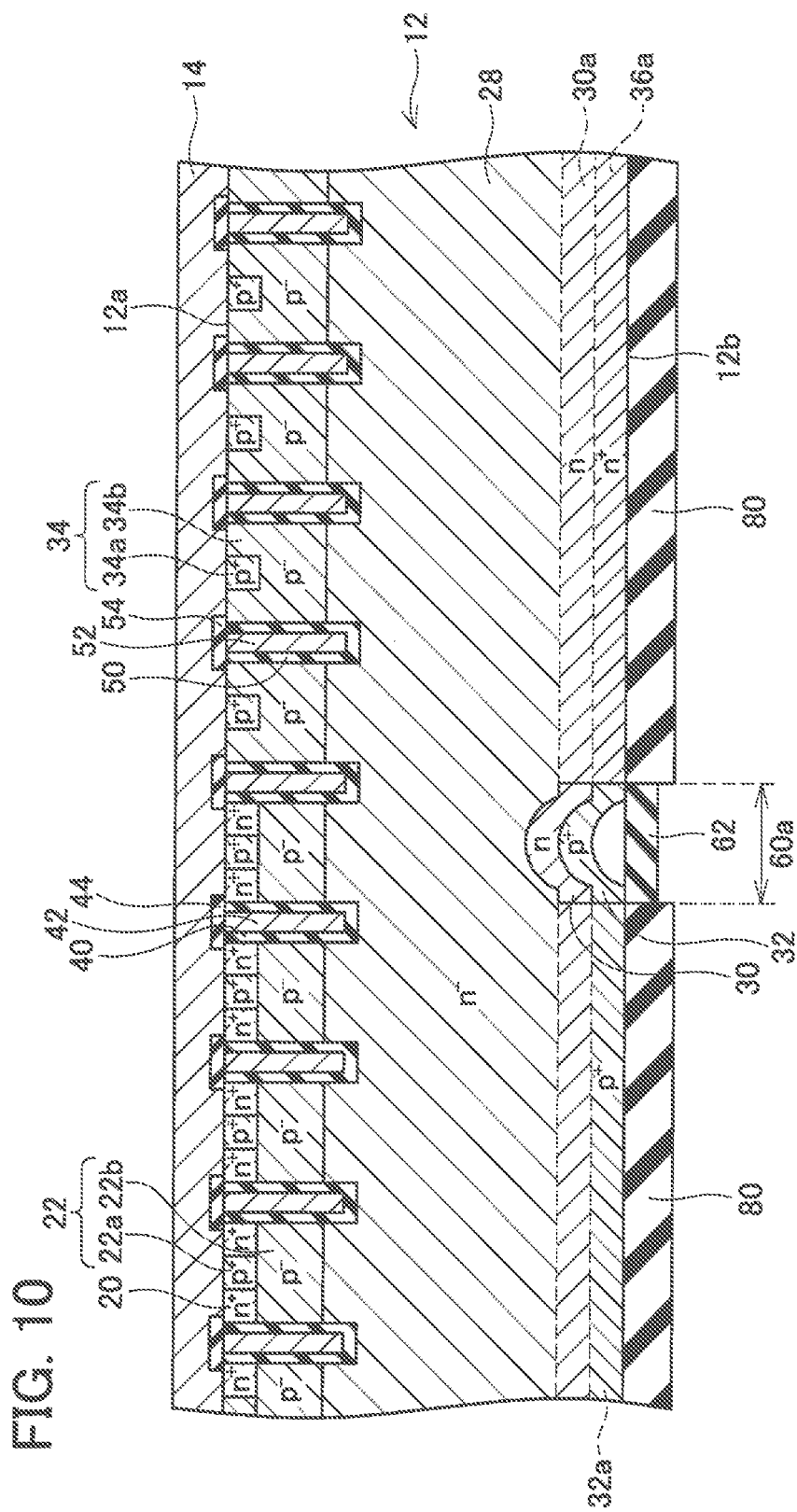
FIG. 10 is a diagram showing the process for manufacturing the semiconductor device 10 of Embodiment 1.

Next, laser annealing is performed on the portion of the lower surface 12b that is located within the area 60a. In this step, a portion of the semiconductor substrate 12 that is located near the lower surface 12b is temporarily melted by heating and then resolidified. At this point time, while the oxide film 62 has a high light transmittivity, the semiconductor substrate 12 has a low light transmittivity. Therefore, a laser irradiated to the lower surface 12b within the area 60a is transmitted through the oxide film 62 and absorbed by the semiconductor substrate 12. This makes it possible to melt the semiconductor substrate 12 without melting the oxide film 62. Such melting of a portion of the semiconductor substrate 12 that is in contact with the oxide film 62 causes the groove 60 to formed in a portion of the lower surface 12b that is in contact with the oxide film 62, as shown in FIG. 10, when the semiconductor substrate 12 resolidifies. Further, the laser annealing causes the impurities to be activated within the area 60a. Thus, the collector region 32 and the buffer region 30 are formed within the area 60a.

Figure 11:
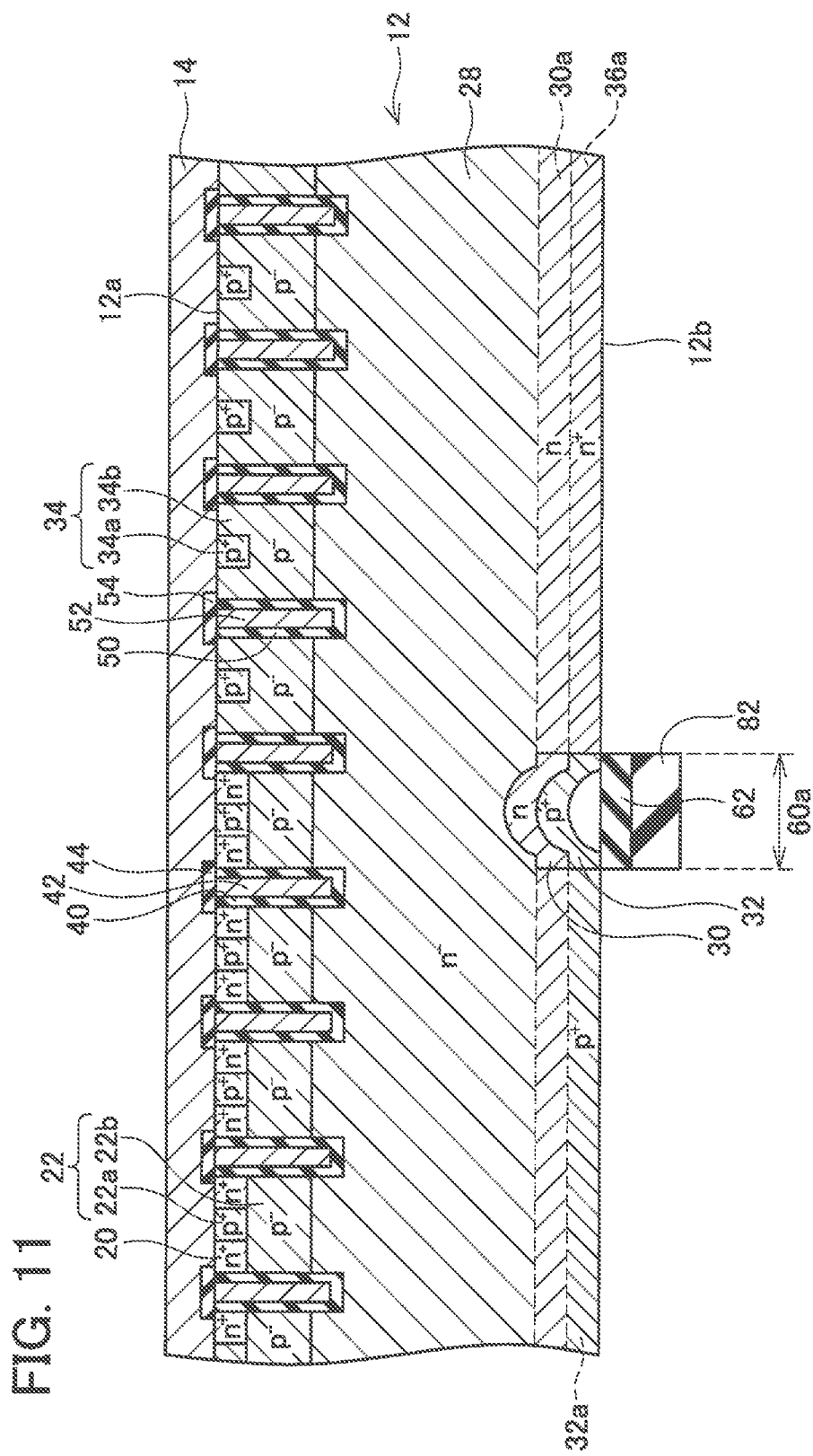
FIG. 11 is a diagram showing the process for manufacturing the semiconductor device 10 of Embodiment 1.

Next, the mask 80 is removed, and as shown in FIG. 11, the area 60a is covered with a mask 82. Next, the lower surface 12b is washed with hydrofluoric acid so that a natural oxide film (extremely thin oxide film) formed on the lower surface 12b is removed. That is, the natural oxide film is removed from a portion of the lower surface 12b that is on the outside of the area 60a. Thus, the portion of the lower surface 12b that is on the outside of the area 60a becomes more planarized.

Figure 12:
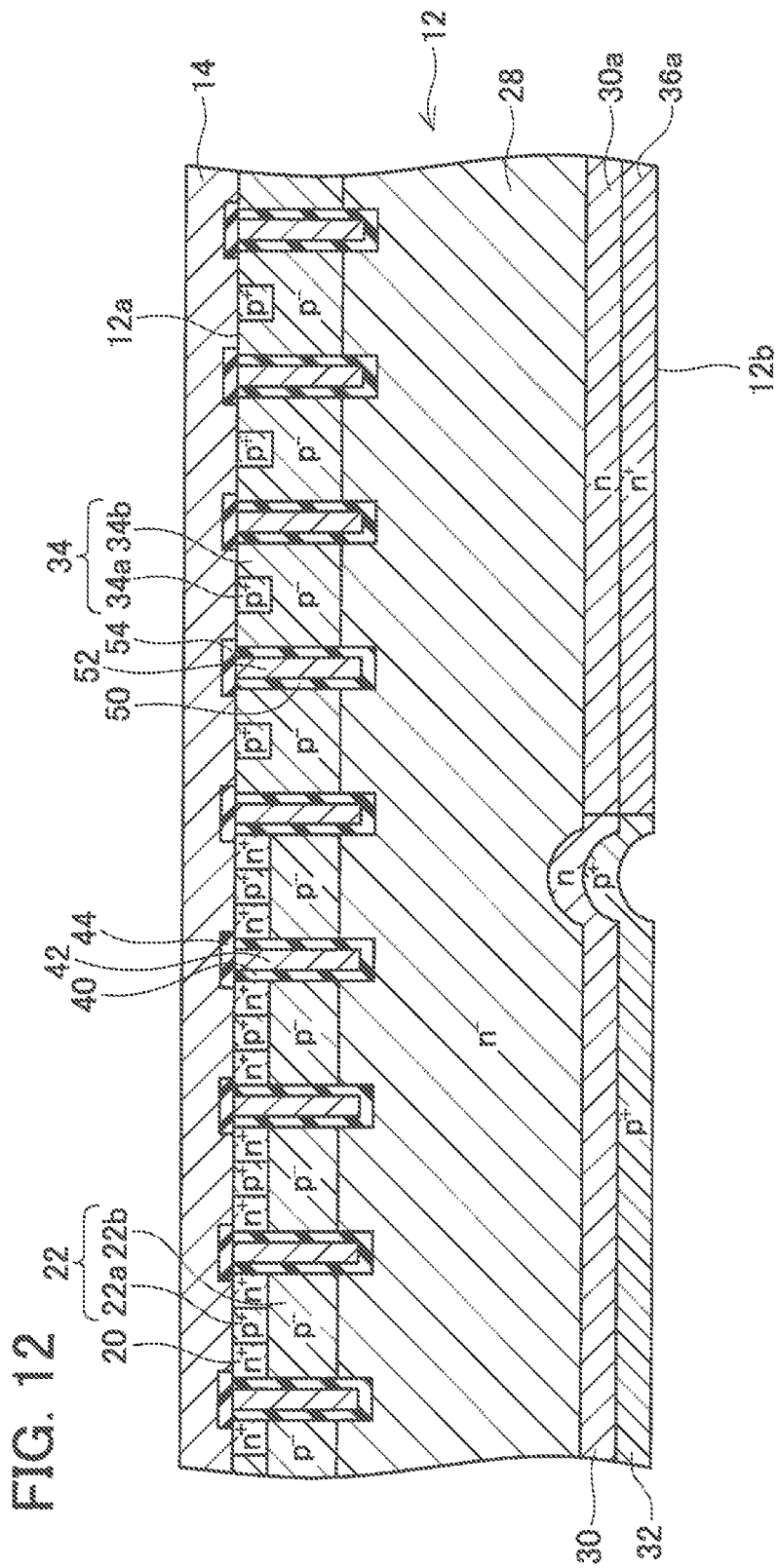
FIG. 12 is a diagram showing the process for manufacturing the semiconductor device 10 of Embodiment 1.

Next, laser annealing is performed on a portion of the lower surface 12b at which the region 36a is exposed. This causes the impurities to be activated, whereby the cathode region 36 and a portion of the buffer region 30 that is on an upper side of the cathode region 36 are formed. Next, laser annealing is performed on a portion of the lower surface 12b at which the region 32a is exposed. This causes the impurities to be activated, whereby the collector region 32 and a portion of the buffer region 30 that is on an upper side of the collector region 32 are formed. After that, the mask 82 and the oxide film 62 are removed, whereby a structure shown in FIG. 12 is obtained.

Next, the lower electrode 16 is formed on the lower surface 12b by sputtering or the like. Thus, the semiconductor device 10 shown in FIG. 1 is completed.

As described above, the method of Embodiment 1 gives a structure in which the groove 60 is formed on the lower surface in the collector region 32 located near the cathode region 36 and the portions of the collector region 32 and the buffer region 30 that are located above the groove 60 are shifted upward. Therefore, the method of Embodiment 1 gives a semiconductor device 10 whose IGBT has a low on-voltage and hardly snaps back. Further, the method of Embodiment 1 makes it possible to reduce the contact resistance of the lower electrode 16 and to make it difficult for the lower electrode 16 to come off from the lower surface 12b.

Further, performing laser annealing through the oxide film 62 as in Embodiment 1 makes it possible to form the groove 60 so that the groove 60 extend in such a manner as to meander along the range of laser annealing. This method makes it possible to form the groove 60 with regularity and high reproducibility. Therefore, this method makes it possible to stably produce semiconductor devices 10.

Embodiment 2

Figure 13:
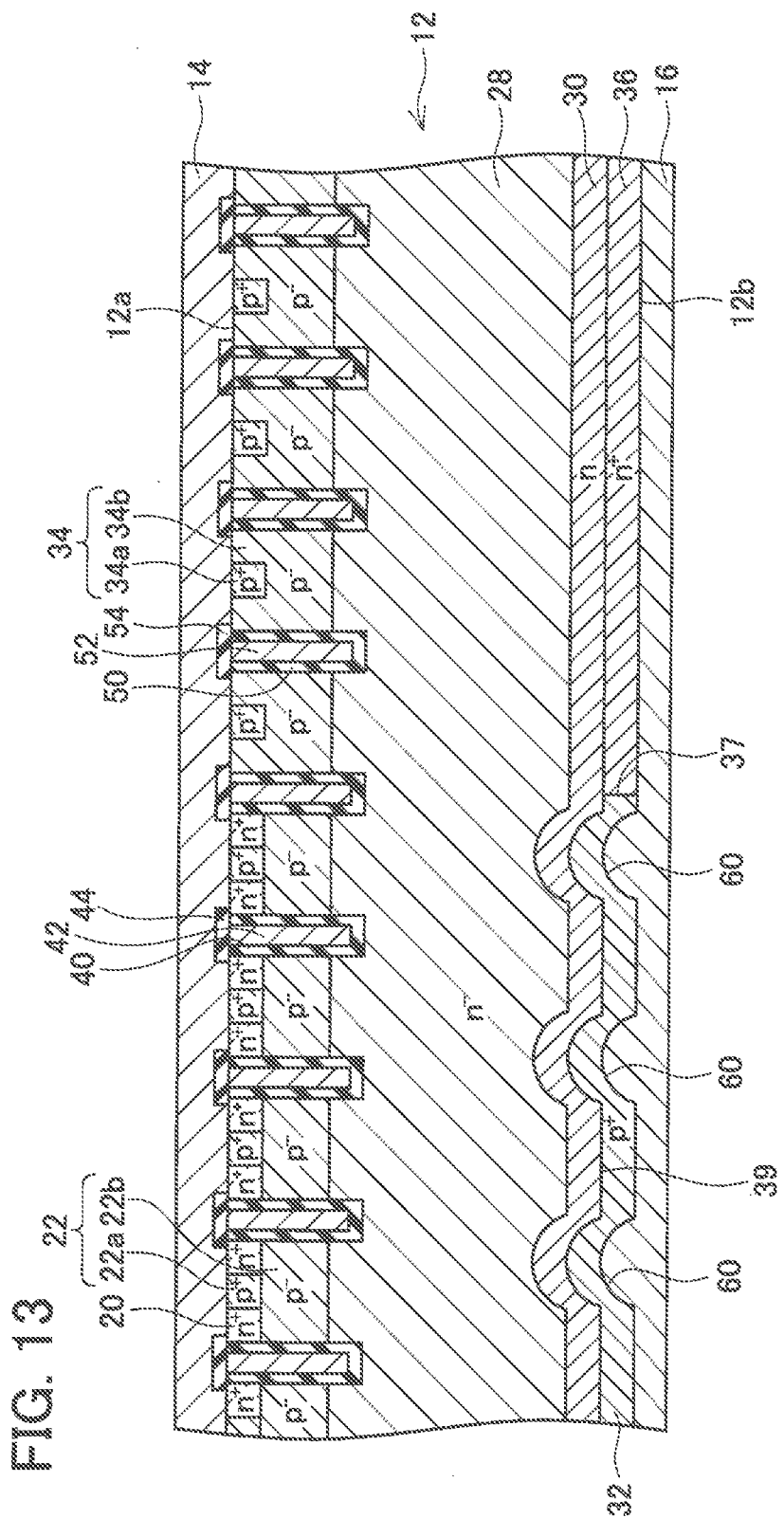
FIG. 13 is a diagram showing a process for manufacturing a semiconductor device of Embodiment 2.

In a semiconductor device of Embodiment 2 as shown in FIG. 13, the groove 60 extends in a mesh fashion across the entire area of a lower surface in the collector region 32. Since the collector region 32 is located so as to surround the cathode region 36, the cathode region 36 is surrounded by the groove 60 in the semiconductor device of Embodiment 2, too. Above each part of the groove 60, the collector region 32 and the buffer region 30 are shifted upward. The semiconductor device of Embodiment 2 has the same components as those of the semiconductor device 10 of Embodiment 1, except for the aforementioned configuration of the groove 60.

The formation of the groove 60 across the entire area of the lower surface in the collector region 32 as in the semiconductor device of Embodiment 2, too, inhibits the flow of electrons from the IGBT region 90 into the diode region 92 via the buffer region 30. For this reason, the semiconductor device of Embodiment 2, too, makes it possible to inhibit a snapback operation and reduce the on-voltage of the IGBT.

Figure 14:
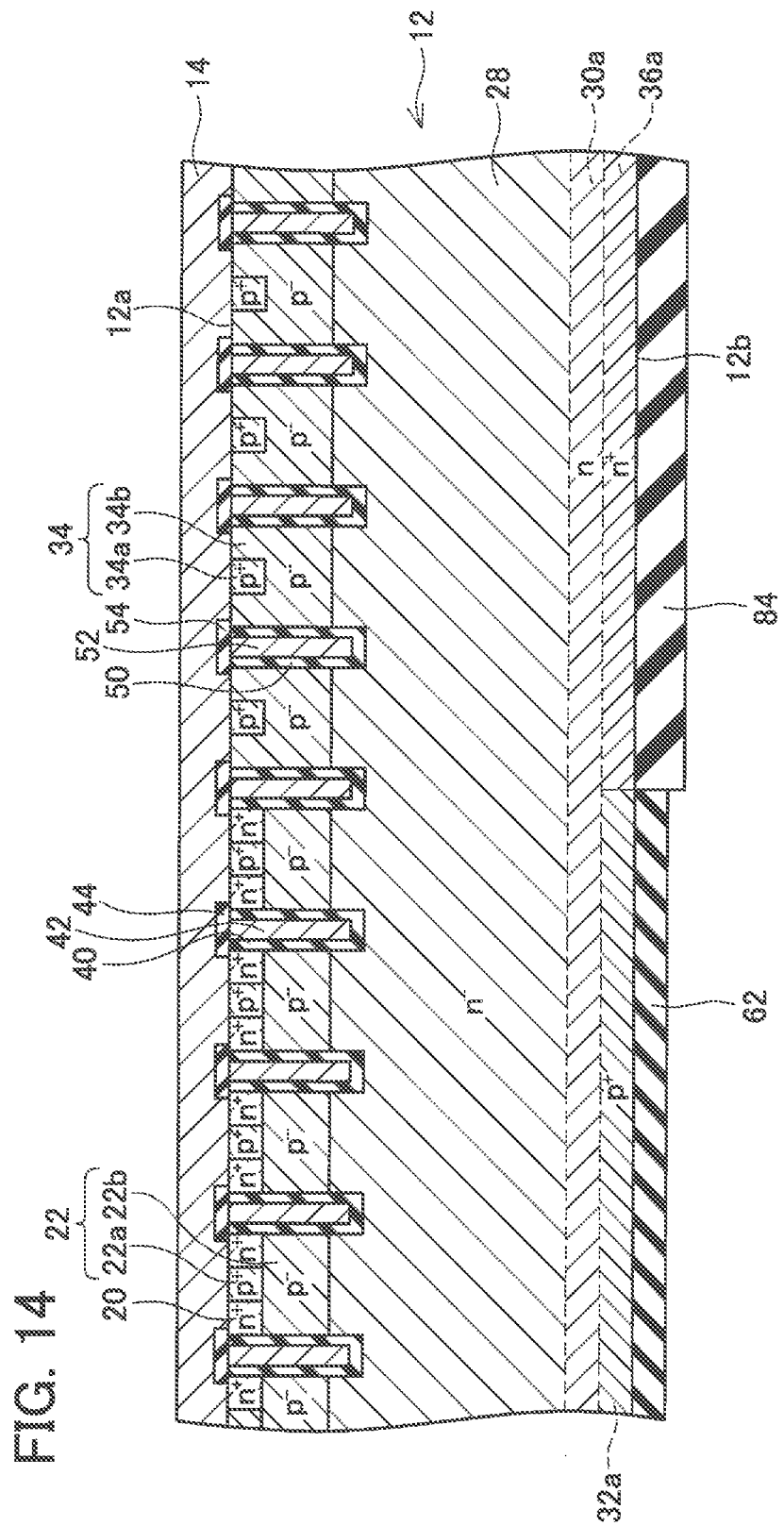
FIG. 14 is a diagram showing the process for manufacturing the semiconductor device of Embodiment 2.
Figure 15:
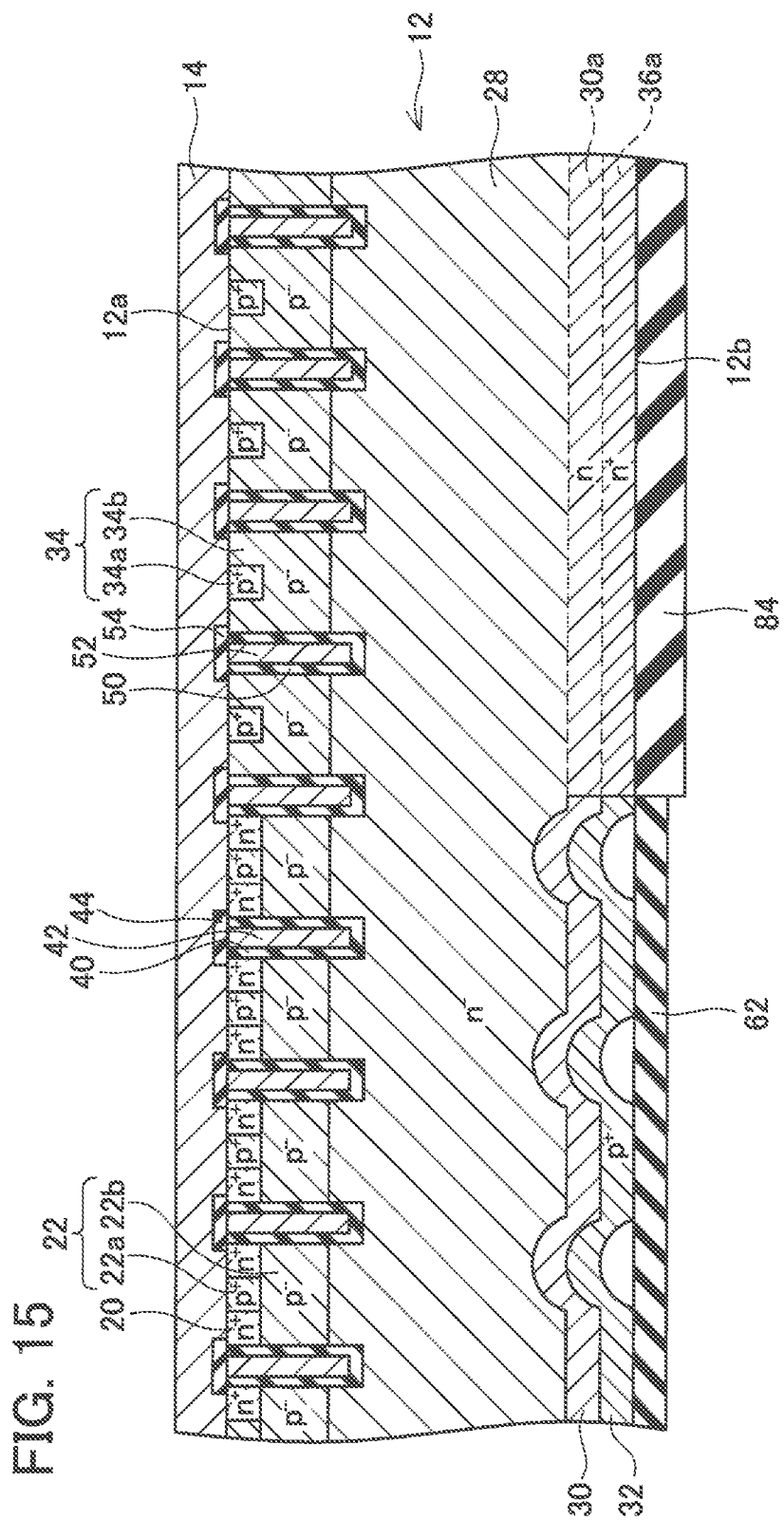
FIG. 15 is a diagram showing the process for manufacturing the semiconductor device of Embodiment 2.

In a process for manufacturing the semiconductor device of Embodiment 2, the structure of FIG. 8 is formed in the same manner as in Embodiment 1. Next, as shown in FIG. 14, the entire area of a lower surface in the region 36a is covered with a mask 84. Next, the oxide film 62 is formed on a lower surface in the region 32a by bringing the lower surface 12b into contact with ammonia-hydrogen peroxide water mixture. Next, laser annealing is performed on the lower surface in the region 32a. In this step, the portion of the semiconductor substrate 12 that is located near the lower surface 12b is temporarily melted and then resolidified. Thus, as shown in FIG. 15, the groove 60 is formed on the lower surface in the region 32a so as to extend in a mesh fashion. Further, the impurities are activated, whereby the collector region 32 and the portion of the buffer region 30 that is on the upper side of the collector region 32 are formed.

Next, the mask 84 is removed. Next, a lower surface in the collector region 32 is covered with a mask. Next, the lower surface in the region 36a is washed with hydrofluoric acid so that a natural oxide film is removed. Next, the cathode region 36 and the portion of the buffer region 30 that is on the upper side of the cathode region 36 are formed by performing laser annealing on the lower surface in the region 36a. Next, the mask and the oxide film 62, which are covering the lower surface in the collector region 32, are removed. Next, the lower electrode 16 is formed, whereby a structure shown in FIG. 13 is obtained.

It should be noted that although no groove is formed in a lower surface in the cathode region 36 in either of Embodiments 1 and 2 described above, a groove may be formed in the lower surface in the cathode region 36. In this case, the groove can be formed by the same method as that which is employed in Embodiments 1 and 2. That is, the groove can be formed in the lower surface in the cathode region 36 by bringing the lower surface in the region 36a into contact with ammonia-hydrogen peroxide water mixture to form an oxide film and performing laser annealing on the lower surface in the region 36a through the oxide film.

Further, in each of Embodiments 1 and 2 described above, the oxide film 62 is formed only in a part where the groove 60 is needed, and laser annealing is performed on the entire region where the oxide film 62 has been formed. However, the oxide film 62 may be formed on a wider area, and laser annealing may be performed only on part of the region where the oxide film 62 has been formed. Alternatively, the oxide film 62 may be partially formed, and laser annealing may be performed on an area wider than the region where the oxide film 62 has been formed. As in these cases, as long as laser annealing is performed on the region where the groove 60 is needed through the oxide film 62, any treatment may be performed on the other regions. Alternatively, laser annealing may be replaced with another heating method that involves the use of light, such as flash lamp annealing.

Further, it is possible to freely select where to provide a groove. No matter where a groove is provided, the contact resistance and adhesion of the lower electrode can be improved. Alternatively, it is possible to employ a technique for providing such a groove in a semiconductor element other than an RC-IGBT (e.g. a single IGBT, a single diode, or another semiconductor element).

Further, in order to bring about the effects of inhibiting a snapback of the IGBT and reducing the on-voltage of the IGBT, it is preferable that the groove be formed at a position on the lower surface in the collector region 32 that is as close as possible to the cathode region 36. The formation of the groove 60 within the region 37a located between the boundary 37 and the gate electrode 42 that is closest to the boundary 37, as in Embodiments 1 and 2, makes it possible to sufficiently bring about the effects of inhibiting a snapback of the IGBT and reducing the on-voltage of the IGBT.

What is claimed is:

1. A method for manufacturing a semiconductor device, the semiconductor device comprises:
   a p-type collector region of an IGBT, the p-type collector region being exposed at a surface of a semiconductor substrate;
   an n-type cathode region of a diode, the n-type cathode region being exposed at the surface of the semiconductor substrate and adjacent to the p-type collector region;
   an n-type buffer region, the n-type buffer region being adjacent to the p-type collector region and the n-type cathode region from a deeper side, wherein an n-type impurity concentration in the n-type buffer region is lower than that in the n-type cathode region; and
   an n-type drift region, the n-type drift region being adjacent to the n-type buffer region from the deeper side, wherein an n-type impurity concentration in the n-type drift region is lower than that in the n-type buffer region,
   the method comprising:
   forming an oxide film on the surface of the semiconductor substrate by bringing the surface into contact with ammonia-hydrogen peroxide water mixture;
   forming a groove in the surface by irradiating light to heat the surface covered with the oxide film;
   removing the oxide film to expose the surface; and
   forming an electrode on the exposed surface.

2. A method of claim 1, wherein a range to which the forming of the oxide film and the heating of the surface are performed includes the surface in the p-type collector region located near a boundary between the n-type cathode region and the p-type collector region.

3. A method of claim 1, wherein the p-type collector region is located so as to surround the n-type cathode region; and a range to which the forming of the oxide film and the heating of the surface are performed is arranged on the surface in the p-type collector region so as to surround the n-type cathode region.

4. A method of claim 1, wherein a range to which the forming of the oxide film and the heating of the surface are performed does not include at least a part of the surface in the n-type cathode region,
   the method further comprises: removing the oxide film on the part of the surface in the n-type cathode region; and heating the part of the surface in the n-type cathode region after the removal of the oxide film on the part of the surface in the n-type cathode region, and in the forming of the electrode, the electrode is formed on the part of the surface in the heated n-type cathode region after the heating of the part of the surface in the n-type cathode region.

5. A method for manufacturing a semiconductor device, the method comprising:
   forming an oxide film on a surface of a semiconductor substrate by bringing the surface into contact with ammonia-hydrogen peroxide water mixture;
   forming a groove in the surface by irradiating light to heat the surface covered with the oxide film;
   removing the oxide film to expose the surface after forming the groove; and
   forming an electrode on the exposed surface.

6. A method of claim 5, wherein the semiconductor device comprises:
   a p-type collector region of an IGBT, the p-type collector region being exposed at the surface;
   an n-type cathode region of a diode, the n-type cathode region being exposed at the surface and adjacent to the p-type collector region;
   an n-type buffer region, the n-type buffer region being adjacent to the p-type collector region and the n-type cathode region from a deeper side, wherein an n-type impurity concentration in the n-type buffer region is lower than that in the n-type cathode region; and
   an n-type drift region, the n-type drift region being adjacent to the n-type buffer region from the deeper side, wherein an n-type impurity concentration in the n-type drift region is lower than that in the n-type buffer region.

7. A method of claim 6, wherein a range to which the forming of the oxide film and the heating of the surface are performed includes the surface in the p-type collector region located near a boundary between the n-type cathode region and the p-type collector region.

8. A method of claim 6, wherein the p-type collector region is located so as to surround the n-type cathode region; and a range to which the forming of the oxide film and the heating of the surface are performed is arranged on the surface in the p-type collector region so as to surround the n-type cathode region.

9. A method of claim 6, wherein a range to which the forming of the oxide film and the heating of the surface are performed does not include at least a part of the surface in the n-type cathode region,
   the method further comprises: removing the oxide film on the part of the surface in the n-type cathode region; and heating the part of the surface in the n-type cathode region after the removal of the oxide film on the part of the surface in the n-type cathode region, and in the forming of the electrode, the electrode is formed on the part of the surface in the heated n-type cathode region after the heating of the part of the surface in the n-type cathode region.

10. A method for manufacturing a semiconductor device, the method comprising:
    forming an oxide film on a surface of a semiconductor substrate by bringing the surface into contact with ammonia-hydrogen peroxide water mixture;
    forming a groove in the surface by irradiating light to melt a portion of the surface without melting the oxide film;
    removing the oxide film to expose the surface; and
    forming an electrode on the exposed surface.

11. A method of claim 10, wherein the semiconductor device comprises:
    a p-type collector region of an IGBT, the p-type collector region being exposed at the surface;
    an n-type cathode region of a diode, the n-type cathode region being exposed at the surface and adjacent to the p-type collector region;
    an n-type buffer region, the n-type buffer region being adjacent to the p-type collector region and the n-type cathode region from a deeper side, wherein an n-type impurity concentration in the n-type buffer region is lower than that in the n-type cathode region; and
    an n-type drift region, the n-type drift region being adjacent to the n-type buffer region from the deeper side, wherein an n-type impurity concentration in the n-type drift region is lower than that in the n-type buffer region.

12. A method of claim 11, wherein a range to which the forming of the oxide film and the heating of the surface are performed includes the surface in the p-type collector region located near a boundary between the n-type cathode region and the p-type collector region.

13. A method of claim 11, wherein the p-type collector region is located so as to surround the n-type cathode region; and a range to which the forming of the oxide film and the heating of the surface are performed is arranged on the surface in the p-type collector region so as to surround the n-type cathode region.

14. A method of claim 11, wherein a range to which the forming of the oxide film and the heating of the surface are performed does not include at least a part of the surface in the n-type cathode region,
  the method further comprises: removing the oxide film on the part of the surface in the n-type cathode region; and
  heating the part of the surface in the n-type cathode region after the removal of the oxide film on the part of the surface in the n-type cathode region, and in the forming of the electrode, the electrode is formed on the part of the surface in the heated n-type cathode region after the heating of the part of the surface in the n-type cathode region.

* * * * *